United States Patent

Matsuda

(10) Patent No.: US 9,853,203 B2
(45) Date of Patent: Dec. 26, 2017

(54) PIEZOELECTRIC ELEMENT WITH UNDERLYING LAYER TO CONTROL CRYSTALLINITY OF A PIEZOELECTRIC LAYER, AND PIEZOELECTRIC DEVICE, INKJET HEAD, AND INKJET PRINTER INCLUDING SUCH PIEZOELECTRIC ELEMENT

(71) Applicant: KONICA MINOLTA, INC., Tokyo (JP)

(72) Inventor: Shinya Matsuda, Takarazuka (JP)

(73) Assignee: KONICA MINOLTA, INC., Tokyo (JP)

( * ) Notice: Subject to any disclaimer, the term of this patent is extended or adjusted under 35 U.S.C. 154(b) by 309 days.

(21) Appl. No.: 14/419,378

(22) PCT Filed: Jul. 25, 2013

(86) PCT No.: PCT/JP2013/070207
§ 371 (c)(1),
(2) Date: Feb. 3, 2015

(87) PCT Pub. No.: WO2014/024695
PCT Pub. Date: Feb. 13, 2014

(65) Prior Publication Data
US 2015/0214468 A1 Jul. 30, 2015

(30) Foreign Application Priority Data
Aug. 8, 2012 (JP) .................................. 2012-175688

(51) Int. Cl.
*H01L 41/18* (2006.01)
*H01L 41/08* (2006.01)
(Continued)

(52) U.S. Cl.
CPC .......... *H01L 41/18* (2013.01); *B41J 2/14201* (2013.01); *B41J 2/14233* (2013.01);
(Continued)

(58) Field of Classification Search
CPC ..... H01L 41/18; H01L 41/053; B41J 2/14201
See application file for complete search history.

(56) References Cited

U.S. PATENT DOCUMENTS 5,248,564 A * 9/1993 Ramesh ................. C23C 14/08
257/295
5,719,417 A * 2/1998 Roeder ............. H01L 21/31691
257/295
(Continued)

FOREIGN PATENT DOCUMENTS

JP 06-290983 10/1994
JP 2000-67650 A 3/2000
(Continued)

OTHER PUBLICATIONS

Extended Search Report in European Patent Application 13827792.6 dated Feb. 26, 2016, 7 pages.
(Continued)

*Primary Examiner* — J. San Martin
(74) *Attorney, Agent, or Firm* — Brinks Gilson & Lione

(57) ABSTRACT

A piezoelectric element includes, on a base, an underlying layer for controlling crystallinity of a piezoelectric layer, and the piezoelectric layer. The piezoelectric layer includes a crystal with an $ABO_3$-type structure having at least Pb at A sites. In the underlying layer, an interface-with-the-base side is configured including at least Pb and another substance with a different composition rate from that of the piezoelectric layer at the A sites, and a substance with a different composition ratio from that of the piezoelectric layer at B sites. In a layer above the interface-with-the-base side in the
(Continued)

underlying layer, the composition rate of the other substance included at the A sites of the underlying layer progressively changes and also the composition ratio of the substance included at the B sites progressively changes, from the interface-with-the-base side toward the interface-with-the-piezoelectric-layer side to approach the composition of the piezoelectric layer.

21 Claims, 8 Drawing Sheets

(51) Int. Cl.
    $H01L\ 41/09$ (2006.01)
    $H01L\ 41/319$ (2013.01)
    $H01L\ 41/187$ (2006.01)
    $B41J\ 2/14$ (2006.01)
    $H01L\ 41/053$ (2006.01)
    $H01L\ 41/316$ (2013.01)
(52) U.S. Cl.
    CPC ........ *H01L 41/053* (2013.01); *H01L 41/0815* (2013.01); *H01L 41/0973* (2013.01); *H01L 41/1875* (2013.01); *H01L 41/1876* (2013.01); *H01L 41/319* (2013.01); *B41J 2202/03* (2013.01); *H01L 41/316* (2013.01)

(56) References Cited

U.S. PATENT DOCUMENTS

| | | | |
|---|---|---|---|
| 5,757,061 A * | 5/1998 | Satoh | H01L 28/56 257/295 |
| 6,096,434 A * | 8/2000 | Yano | C30B 23/02 117/944 |
| 6,111,284 A | 8/2000 | Sakurai | |
| 6,350,644 B1 | 2/2002 | Sakurai | |
| 6,523,943 B1 * | 2/2003 | Fukui | H01L 41/187 347/68 |
| 6,849,166 B2 * | 2/2005 | Kita | H01L 28/56 204/192.15 |
| 6,853,021 B2 * | 2/2005 | Sakurai | C23C 16/409 257/295 |
| 6,969,157 B2 | 11/2005 | Tomozawa et al. | |
| 7,287,840 B2 * | 10/2007 | Miyazawa | B41J 2/14233 252/62.9 PZ |
| 7,350,904 B2 * | 4/2008 | Noguchi | B41J 2/161 347/68 |
| 8,119,024 B1 * | 2/2012 | Matsushita | C30B 11/04 117/81 |
| 9,450,171 B2 * | 9/2016 | Xiong | H01L 41/0805 |
| 2002/0076875 A1 * | 6/2002 | Wasa | B41J 2/161 438/207 |
| 2003/0062554 A1 | 4/2003 | Sakurai et al. | |
| 2003/0222947 A1 | 12/2003 | Tomozawa et al. | |
| 2004/0125176 A1 * | 7/2004 | Kobayashi | B41J 2/1617 347/68 |
| 2005/0023934 A1 * | 2/2005 | Takeuchi | G10K 11/26 310/334 |
| 2005/0280335 A1 | 12/2005 | Tomozawa et al. | |
| 2006/0118840 A1 * | 6/2006 | Ezhilvalavan | H01G 7/06 257/295 |
| 2007/0278904 A1 * | 12/2007 | Shibata | H01L 41/1873 310/358 |
| 2007/0278907 A1 * | 12/2007 | Kondo | H01L 41/0471 310/364 |
| 2015/0214465 A1 * | 7/2015 | Mawatari | H01L 41/0815 347/68 |

FOREIGN PATENT DOCUMENTS

| | | |
|---|---|---|
| JP | 2003-86586 A | 3/2003 |
| JP | 2004-235599 | 8/2004 |
| JP | 2004-235599 A | 8/2004 |
| JP | 2006-303519 | 11/2006 |
| JP | 2007-42983 A | 2/2007 |
| JP | 2008-042069 | 2/2008 |
| JP | 2008-42069 A | 2/2008 |
| JP | 2010-34206 A | 2/2010 |

OTHER PUBLICATIONS

International Search Report in International Application No. PCT/JP2013/070207, dated Oct. 22, 2013, 4 pages.
Written Opinion of the International Searching Authority in International Application PCT/JP2013/070207, 2 pages.
Office Action dated Oct. 18, 2016 regarding corresponding Japanese patent application 2014-529422, two pages, including English-language translation of Office Action, 6 pages.

* cited by examiner

| FUNCTIONAL LAYER | MATERIAL | EXPANSION COEFFICIENT (ppm/K) | LATTICE CONSTANT (nm) |
|---|---|---|---|
| SUBSTRATE | Si | 2.6 | 0.54 |
| LOWER ELECTRODE | Pt | 8.8 | 0.39 |
| PIEZOELECTRIC LAYER | PZT | 6.7 | 0.41 |
| UNDERLYING LAYER | PLT | 5 ~ 6 | 0.40 |

_US 9,853,203 B2_

PIEZOELECTRIC ELEMENT WITH UNDERLYING LAYER TO CONTROL CRYSTALLINITY OF A PIEZOELECTRIC LAYER, AND PIEZOELECTRIC DEVICE, INKJET HEAD, AND INKJET PRINTER INCLUDING SUCH PIEZOELECTRIC ELEMENT

TECHNICAL FIELD

The present invention relates to a piezoelectric element including, on a base, an underlying layer for controlling the crystallinity of a piezoelectric layer, and the piezoelectric layer, a piezoelectric device including the piezoelectric element, an inkjet head including the piezoelectric device, and an inkjet printer.

BACKGROUND ART

Piezoelectric materials such as PZT (lead zirconate titanate) have conventionally been used as electromechanical converting elements such as drive elements and sensors. On the other hand, a MEMS (Micro Electro Mechanical Systems) element using a Si substrate is increasing in number in response to recent years' requests for downsizing, densification, further cost reduction, and the like of an apparatus. If the piezoelectric material is applied to the MEMS element, various devices such as inkjet heads, ultrasonic sensors, infrared sensors, and frequency filters can be created.

Here, if the piezoelectric material is applied to the MEMS element, it is desired to make the piezoelectric material into thin film. This is because making the piezoelectric material into thin film has the following advantages: In other words, highly accurate processing using semiconductor processing techniques such as film deposition and photolithography becomes possible, and downsizing and densification can be achieved. The piezoelectric material can be processed over a large-area wafer in one batch. Accordingly, the cost can be reduced. The conversion efficiency of an electric machine improves, and the properties of the drive element and the sensitivity of the sensor improve.

Chemical methods such as CVD (Chemical Vapor Deposition), physical methods such as sputtering and ion plating, and deposition methods in a liquid phase such as the sol-gel process are known as a method for depositing the piezoelectric material on a substrate of Si or the like.

The piezoelectric material such as PZT is generally an $ABO_3$-type oxide, which is known to show an excellent piezoelectric effect when its crystal takes a perovskite structure. FIG. 10 schematically illustrates a crystal structure of PZT. For example, in a tetragon of $Pb(Zr_x, Ti_{1-x})O_3$, the perovskite structure is a structure where a Pb atom is located at vertexes (A sites) of the tetragon, a Ti or Zr atom is located at a body center (B site), and an O atom is located at face centers.

Moreover, PZT is a solid solution of PTO ($PbTiO_3$; titanate) and PZO ($PbZrO_3$; zirconate), which both take the perovskite structure. The entire PZT becomes tetragonal when the ratio of PTO is high, and becomes rhombohedral when the ratio of PZO is high.

FIG. 11 illustrates the relationship between the composition ratio of PTO to PZO and the crystal system. When the composition ratio of PTO to PZO is approximately 48/52 to 47/53, the crystal system changes from a tetragon to a rhombohedron, or from a rhombohedron to a tetragon. A boundary where the crystal system changes in this manner is referred to as the morphotropic phase boundary (MPB; Morphotropic phase boundary), and hereinafter also simply referred to as the phase boundary. Around room temperature, the crystal structure of PZT is tetragonal, rhombohedral, or a mixed crystal (phase boundary) of them. However, at or above the Curie temperature, the crystal structure of PZT becomes a cubit crystal at any composition ratio of PTO to PZO.

FIG. 12 illustrates the relationship between the composition ratio of PTO to PZO and the properties (relative permittivity and electromechanical coupling factor). On the above phase boundary, both the relative permittivity and the electromechanical coupling factor specifically increase. There is a positive correlation between the relative permittivity and a piezoelectric constant (a displacement per unit electric field). When the relative permittivity increases, then the piezoelectric constant increases. Moreover, the electromechanical coupling factor is an indicator of efficiency of the conversion from an electrical signal into mechanical distortion, or from mechanical distortion into an electrical signal. When the factor increases, the conversion efficiency increases.

If PZT is formed into thin film (of a thickness of approximately several microns) on a Si substrate, it is difficult to obtain desired properties. This is considered because the perovskite structure required in PZT, and the above phase boundary cannot be achieved due to residual stress caused by differences in lattice constant and linear expansion coefficient between the substrate and lower electrode, and PZT. If the crystallinity of PZT (especially an initial layer) in the vicinity of the interface with the substrate and the lower electrode decreases due to the influence of such differences in lattice constant and linear expansion coefficient, reliability such as the adhesion between the piezoelectric layer and the substrate, and dielectric strength significantly decreases.

Hence, a technology is known which provides an underlying layer (buffer layer or seed layer) for controlling the crystallinity of the piezoelectric layer between the substrate and the piezoelectric layer. For example, in Patent Literature 1, an underlying layer including PLT (lead lanthanum titanate) is provided between a substrate and a piezoelectric layer (for example, PLZT; lead lanthanum zirconate titanate). PLT of the underlying layer has a property where a perovskite crystal tends to occur even on a Si substrate and a lower electrode. Therefore, it becomes easy to form the piezoelectric layer with the perovskite structure by forming the piezoelectric layer on such an underlying layer.

However, the composition of the underlying layer (PLT) is not in perfect agreement with that of the piezoelectric layer (PLZT). Accordingly, even if PLT is used as the underlying layer, the disagreement between the underlying layer and the piezoelectric layer cannot be perfectly solved. As a result, a low region with low crystallinity still remains in the initial layer of the piezoelectric layer.

Hence, for example, in Patent Literature 2, a middle layer including the gradient of the composition that has continuously been changed to the composition in the vicinity of the phase boundary of PZT by continuously increasing the concentration of Zr (zirconium) is provided between a first layer including PLT and a second layer including PZT, and the disagreements of the lattice constant and the linear expansion coefficient are eased in the middle layer.

CITATION LIST

Patent Literatures

Patent Literature 1: JP 6-290983 A (see claim 1, paragraphs [0008] and [0014], FIG. 1, and the like)

Patent Literature 2: JP 2006-303519 A (see paragraphs [0021] to [0028], FIG. 2, and the like)

SUMMARY OF INVENTION

Technical Problem

However, Patent Literature 2 does not at all disclose a change in the concentration of La (lanthanum) in the middle layer on the first layer. The concentration of La is considered to be zero. In other words, the concentration of La suddenly decreases from the concentration of the first layer to zero in the vicinity of the interface between the first layer and the middle layer. Such a sudden change in the concentration of La has not a little influence on the crystallinity of the middle layer. It becomes difficult to inherit the excellent crystallinity of the first layer and form the middle layer with excellent crystallinity. As a result, a problem arises in which it becomes difficult to form the second layer (piezoelectric layer) with excellent crystallinity on the middle layer, and the piezoelectric properties and the reliability such as dielectric strength cannot be improved.

The present invention has been made considering the above problem, and an object thereof is to provide a piezoelectric element that can form a piezoelectric layer with excellent crystallinity from near an interface with an underlying layer by avoiding a sudden change in the composition of the underlying layer in a film thickness direction, and accordingly can improve piezoelectric properties and reliability, a piezoelectric device including the piezoelectric element, an inkjet head including the piezoelectric device, and an inkjet printer.

Solution to Problem

A piezoelectric element according to an aspect of the present invention is a piezoelectric element including: on a base, an underlying layer for controlling the crystallinity of a piezoelectric layer; and the piezoelectric layer, wherein the piezoelectric layer includes a crystal with an $ABO_3$-type structure having at least Pb at A sites, and in the underlying layer, an interface-with-the-base side is configured including at least Pb and another substance with a different composition rate from that of the piezoelectric layer at the A sites, and a substance with a different composition ratio from that of the piezoelectric layer at B sites, and accordingly has a predetermined crystal structure with better crystallinity than the piezoelectric layer, and a layer above the interface-with-the-base side is configured to approach the composition of the piezoelectric layer by progressively changing the composition rate of the other substance included at the A sites of the underlying layer and also the composition ratio of the substance included at the B sites, from the interface-with-the-base side toward the interface-with-the-piezoelectric-layer side.

DESCRIPTION OF EMBODIMENTS

One embodiment of the present invention is described based on the drawings as follows:

[1. Configuration of Piezoelectric Element]

Figures 1, 2:
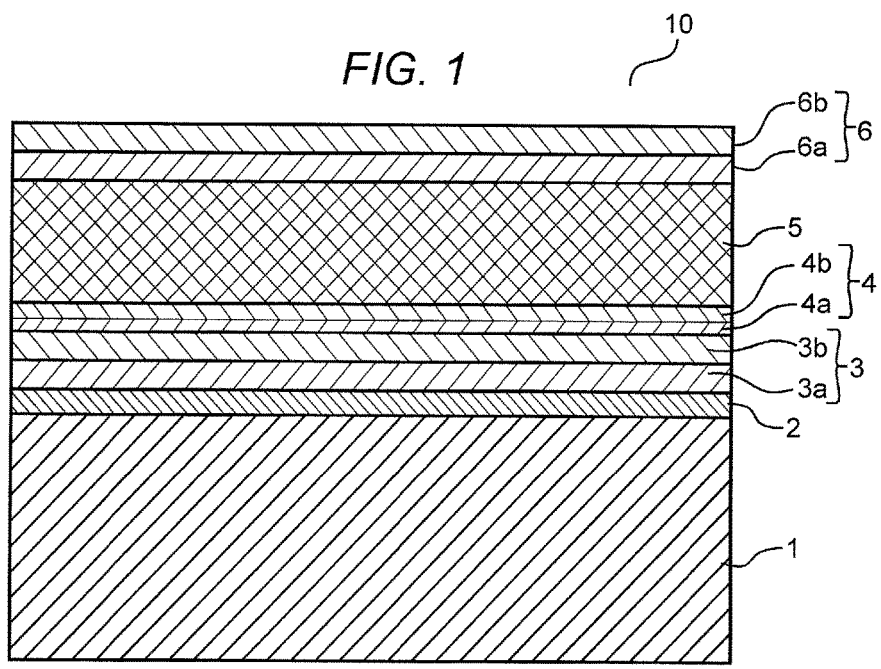
FIG. 1 is a cross-sectional view illustrating a schematic configuration of a piezoelectric element according to one embodiment of the present invention.
FIG. 2 is an explanatory view illustrating the linear expansion coefficients and lattice constants of materials forming main layers of the piezoelectric element.

FIG. 1 is a cross-sectional view illustrating a schematic configuration of a piezoelectric element 10 according to the embodiment. The piezoelectric element 10 of the embodiment is configured laminating a thermal oxide film 2, a lower electrode 3, an underlying layer 4, a piezoelectric layer 5, and an upper electrode 6 in this order on a substrate 1. The substrate 1, the thermal oxide film 2, and the lower electrode 3 form a base on which the underlying layer 4 is formed.

The substrate 1 is configured of a semiconductor substrate formed of only monocrystalline Si (silicon), or a SOI (Silicon on Insulator) substrate with a thickness of, for example, approximately 300 to 500 μm. The thermal oxide film 2 includes $SiO_2$ (silicon oxide) with a thickness of, for example, approximately 0.1 μm, and is formed for the purpose of protection and insulation of the substrate 1.

The lower electrode 3 is configured laminating a Ti (titanium) layer 3a and a Pt (platinum) layer 3b. The Ti layer 3a is formed to improve the adhesion between the thermal oxide film 2 and the Pt layer 3b. The thickness of the Ti layer 3a is, for example, approximately 0.02 μm. The thickness of the Pt layer 3b is, for example, approximately 0.1 μm.

The underlying layer 4 is a layer for controlling the crystallinity of the piezoelectric layer 5, and is also called the buffer layer or seed layer. The detailed configuration of the underlying layer 4 is described later.

The piezoelectric layer 5 includes PZT (lead zirconate titanate) being a solid solution of PTO ($PbTiO_2$; titanate) and PZO ($PbZrO_2$; zirconate). The thickness of PZT varies depending on the application. However, generally, the thickness of PZT is, for example, 1 μm or less, in applications for a memory and a sensor, and is, for example, 3 to 5 μm in an application for an actuator. In the embodiment, the Ti/Zr ratio of the piezoelectric layer 5 is set to a ratio (48/52 to 47/53) forming the above-mentioned morphotropic phase boundary (MPB).

The upper electrode 6 is configured laminating a Ti layer 6a and a Pt layer 6b. The Ti layer 6a is formed to improve the adhesion between the piezoelectric layer 5 and the Pt layer 6b. The thickness of the Ti layer 6a is, for example, approximately 0.02 μm. The thickness of the Pt layer 6b is, for example, approximately 0.1 to 0.2 μm.

In this manner, the piezoelectric element 10 includes at least the substrate 1, the lower electrode 3 located on a substrate 1 side of the piezoelectric layer 5, and the upper electrode 6 located on a side of the piezoelectric layer 5, the side being opposite to the lower electrode 3. Consequently, as described below, it is possible to achieve a configuration where voltage is applied to the upper electrode 6 and the lower electrode 3 to deform the piezoelectric layer 5, or conversely the piezoelectric layer 5 is deformed to extract a potential difference caused at the time of the deformation from the upper electrode 6 and the lower electrode 3.

[2. Regarding Details of Underlying Layer]

FIG. 2 illustrates the linear expansion coefficients and lattice constants of materials forming main layers of the piezoelectric element 10. As illustrated in the figure, the linear expansion coefficient and the lattice constant are very different between the substrate 1 (Si) and the piezoelectric layer 5 (PZT). Such disagreements of the linear expansion coefficient and the lattice constant are slightly eased by locating the lower electrode 3 between the substrate 1 and the piezoelectric layer 5. In other words, the differences in linear expansion coefficient and lattice constant between the lower electrode 3 and the piezoelectric layer 5 are smaller than the differences in linear expansion coefficient and lattice constant between the substrate 1 and the piezoelectric layer 5. However, it cannot be said that the differences in linear expansion coefficient and lattice constant are sufficiently small to achieve the perovskite structure required by the piezoelectric layer 5, and the phase boundary of the crystal phase. It is insufficient to obtain the desired piezoelectric properties and dielectric strength.

On the other hand, the linear expansion coefficient and lattice constant of PLT change depending on the amount of addition of La (lanthanum), but are substantially equal to the linear expansion coefficient and lattice constant of PZT forming the piezoelectric layer 5. Hence, the embodiment is configured such that the underlying layer 4 including PLT is provided between the lower electrode 3 and the piezoelectric layer 5, and also the composition of the underlying layer 4 is changed in the film thickness direction, and accordingly the desired piezoelectric properties and dielectric strength are obtained.

Figure 3:
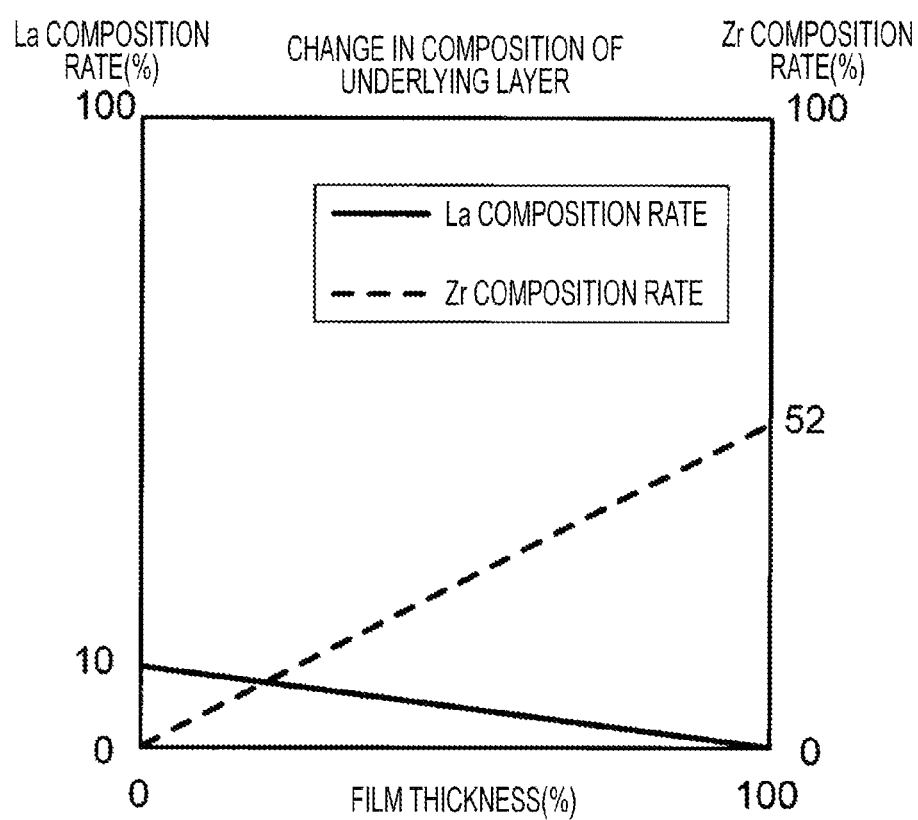
FIG. 3 is a graph illustrating composition changes in the film thickness direction of an underlying layer of the piezoelectric element.

FIG. 3 illustrates changes in a La composition rate and a Zr (zirconium) composition rate in the film thickness direction of the underlying layer 4. A film thickness of 0% corresponds to an interface of the underlying layer 4 with the base (the lower electrode 3). A film thickness of 100% corresponds to an interface of the underlying layer 4 with the piezoelectric layer 5.

As illustrated in the figure, around a film thickness of 0%, the composition rate of La ((La/(Pb+La))) is 10%, and the composition rate of Zr ((Zr/(Zr+Ti))) is 0%. Therefore, in the underlying layer 4, the interface-with-the-base side can be said to be a layer 4a of PLT with a monocrystalline structure (tetragon), in other words, PTO with the addition of La. Moreover, around a film thickness of 100%, the composition rate of La is 0%, and the composition rate of Zr is 52%. Therefore, in the underlying layer 4, the interface-with-the-piezoelectric-layer-5 side is PZT with the same composition as that of the piezoelectric layer 5. Moreover, in a layer 4b of the underlying layer 4 that is positioned above the layer 4a of PLT as schematically illustrated in FIG. 1, the composition rate of La included in the underlying layer 4 continuously decreases and the composition rate of Zr continuously increases, from the PLT side toward the interface-with-the-piezoelectric-layer-5 side. Accordingly, the composition of the underlying layer 4 approaches that of the piezoelectric layer 5. In other words, La decreases and Pb increases at the A sites and Ti decreases and Zr increases at the B sites, from the interface-with-the-base side toward the interface-with-the-piezoelectric-layer-5 side in the underlying layer 4. The change of the composition rates of La and Zr at this point in time may be a linear change as illustrated in FIG. 3 or may be a curved change. Moreover, even if the change is a linear change as in FIG. 3, the degree of the change may change in the middle. Note that the embodiment of the underlying layer 4 shown in FIG. 1 is for illustrative purposes only and is not to be construed as a limitation as to the respective sizes and shapes of layers 4a and 4b of the underlying layer 4.

Furthermore, as illustrated in FIG. 3, not only the composition rates of La and Zr change across the entire underlying layer 4 from the interface with the base to the interface with the piezoelectric layer 5, but also at least one of the decrease in the composition rate of La and the increase in the composition rate of Zr may start from the middle when viewed from the interface-with-the-base side. In this case, the underlying layer 4 contains a PLT layer having a predetermined thickness, on a side close to the interface with the base. Furthermore, one of the decrease in the composition rate of La and the increase in the composition rate of Zr may end in the middle when viewed from the interface-with-the-base side. In this case, the underlying layer 4 contains a PZT layer having a different composition ratio from that of the piezoelectric layer 5, on a side close to the interface with the piezoelectric layer 5. Alternatively, La in PLT on the interface-with-the-base side may decrease first, and PLT becomes PT. Zr may subsequently increase, and Pt becomes PZT.

In this manner, the interface side with the lower electrode 3 in the underlying layer 4 includes PLT having the perovskite structure without Zr. Accordingly, an excellent perovskite crystal tends to occur. When there is an excellent perovskite crystal in PLT in the early stage of the deposition of the underlying layer 4, even if La is then decreased and Zr is increased in the film thickness direction in the layer above PLT, the perovskite crystallinity is not reduced.

Especially, the composition rate of La being a structural element of PLT is continuously (gradually) changed and also the composition rate of Zr is continuously (gradually) changed, toward the interface with the piezoelectric layer 5 in the layer above PLT. Accordingly, it is possible to avoid a sudden change in composition between PLT and the layer above PLT. Consequently, it is possible to form the layer above PLT while inheriting the excellent perovskite crystallinity of PLT, and make the perovskite crystallinity excellent across the entire underlying layer 4. Therefore, it is possible to form the piezoelectric layer 5 with a layer having excellent perovskite crystallinity, on the underlying layer 4 from near an interface with the underlying layer 4.

In addition, the composition of the underlying layer 4 approaches the composition of the piezoelectric layer 5 intended to form, toward the interface-with-the-piezoelectric-layer-5 side. Accordingly, the lattice constant and linear expansion coefficient of the underlying layer 4 gradually approaches those of the piezoelectric layer 5. Consequently, the piezoelectric layer 5 can be easily formed on the underlying layer 4 with desired composition from the early stage of deposition.

In this manner, the piezoelectric layer 5 can be formed on the underlying layer 4 with excellent crystallinity and desired composition. Accordingly, the piezoelectric properties of the piezoelectric layer 5 can be improved while reliability such as the adhesion of the piezoelectric layer 5 to the layer therebelow, and dielectric strength can be improved.

Moreover, in the underlying layer 4, the interface-with-the-piezoelectric-layer-5 side has the same composition as the piezoelectric layer 5 intended to form. In other words, the composition rates of La and Zr are changed until the interface-with-the-piezoelectric-layer-5 side has the same composition as the piezoelectric layer 5 in the underlying layer 4. Consequently, the piezoelectric layer 5 can continuously be formed on the underlying layer 4 with the same composition. The piezoelectric layer 5 can be surely formed with desired composition. Especially, the Ti/Zr ratio of the piezoelectric layer 5 is a ratio that forms the MPB (a MPB ratio). Accordingly, the piezoelectric layer 5 is formed at such a MPB ratio, and the piezoelectric properties such as a piezoelectric constant can be dramatically improved.

The Ti/Zr ratio of the piezoelectric layer 5 is not limited to the MPB ratio, and may be a ratio other than the MPB ratio. However, from the viewpoint of improving the piezoelectric properties, the Ti/Zr ratio is desired to be a ratio as close to the MPB ratio as possible. Even if the Ti/Zr ratio of the piezoelectric layer 5 is a ratio other than the MPB ratio, the Zr composition rate of the underlying layer 4 is required to be changed in the film thickness direction such that the Zr composition rate (Ti/Zr ratio) in the vicinity of the interface with the piezoelectric layer 5 in the underlying layer 4 is the same as the Zr composition rate (Ti/Zr ratio) of the piezoelectric layer 5.

The composition rate of La in PLT of the underlying layer 4 is desired to be approximately 5 to 15%, and especially desired to be in the neighborhood of 10%, in terms of realizing excellent perovskite crystallinity.

The above description is given of the case of forming the piezoelectric layer 5 with PZT. However, the piezoelectric layer 5 may include PLZT (PZT with the addition of La). Also in the case where the piezoelectric layer 5 includes PLZT, the composition rates of La and Zr are required to be changed such that the composition of the underlying layer 4 in the vicinity of the interface with the piezoelectric layer 5 (in the vicinity of a film thickness of 100%) has the same composition as the piezoelectric layer 5 (PLZT). In other words, the composition rate of La of the underlying layer 4 in the vicinity of a film thickness of 100% is not limited to 0%. The composition rate of La is simply required to be changed in such a manner as to agree with the composition of the piezoelectric layer 5.

As an example, the interface-with-the-base side of the underlying layer 4 may include PLT including 10% of La, the composition ratio of La of the underlying layer 4 in the interface with the piezoelectric layer 5 may be decreased with decreasing distance to the piezoelectric layer 5 to make the composition ratio of La 3%, and the piezoelectric layer 5 may be made PLZT including 3% of La.

[3. Manufacturing Method of Piezoelectric Element]

Figure 4:
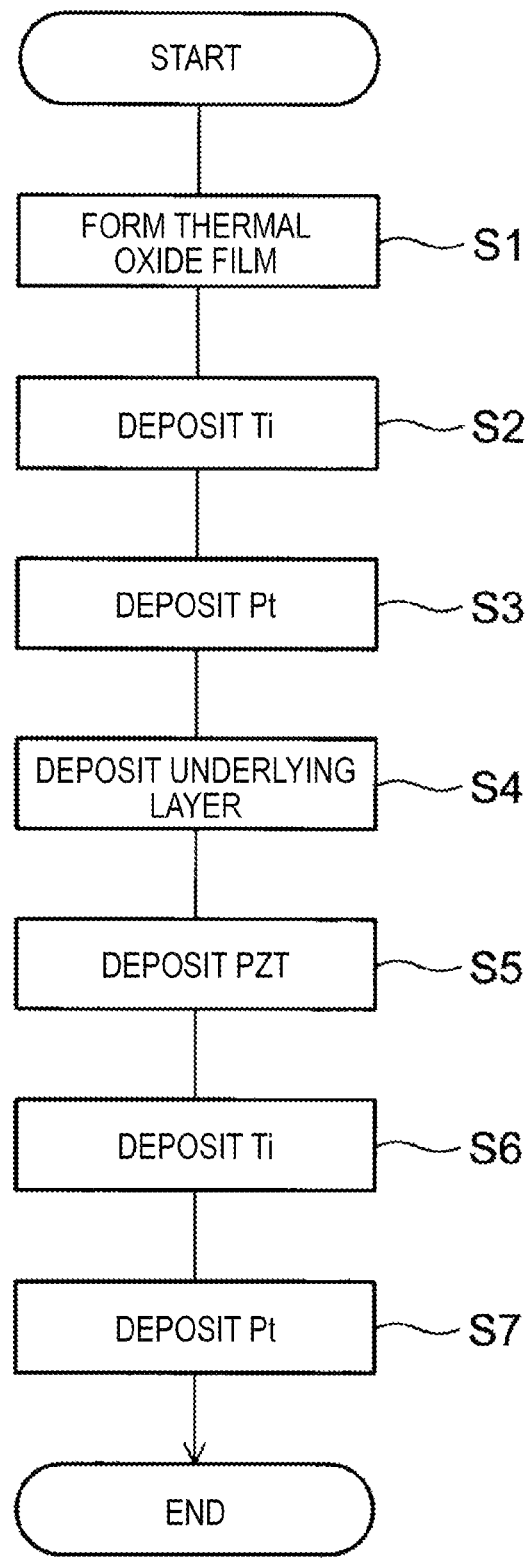
FIG. 4 is a flowchart illustrating the flow of a manufacturing process of the piezoelectric element.

Next, a manufacturing method of the piezoelectric element 10 of the embodiment is described based on a flowchart of FIG. 4 with reference to FIG. 1.

Firstly, the thermal oxide film 2 including $SiO_2$ for insulation and protection is formed on the surface of the substrate 1 (S1). The thermal oxide film 2 can be formed by heating the substrate 1 at approximately 1000° C. Next, Ti and Pt are deposited sequentially on the thermal oxide film 2 of the substrate 1 by sputtering to form the lower electrode 3 including the Ti layer 3a and the Pt layer 3b (S2 and S3).

Next, the substrate 1 is heated to approximately 600° C. to deposit the underlying layer 4 on the lower electrode 3 by sputtering (S4). The piezoelectric layer 5 including PZT is then deposited on the underlying layer 4 at the same substrate temperature by sputtering (S5). The details of the deposition method of the underlying layer 4 and the piezoelectric layer 5 are described later. The deposition temperature of the underlying layer 4 and the piezoelectric layer 5 may be different depending on their materials.

Lastly, Ti and Pt are deposited sequentially on the piezoelectric layer 5 by sputtering to form the upper electrode 6 including the Ti layer 6a and the Pt layer 6b (S6 and S7). The piezoelectric element 10 is completed.

[4. Details of Deposition Method of Underlying Layer and Piezoelectric Layer]

Figure 5:
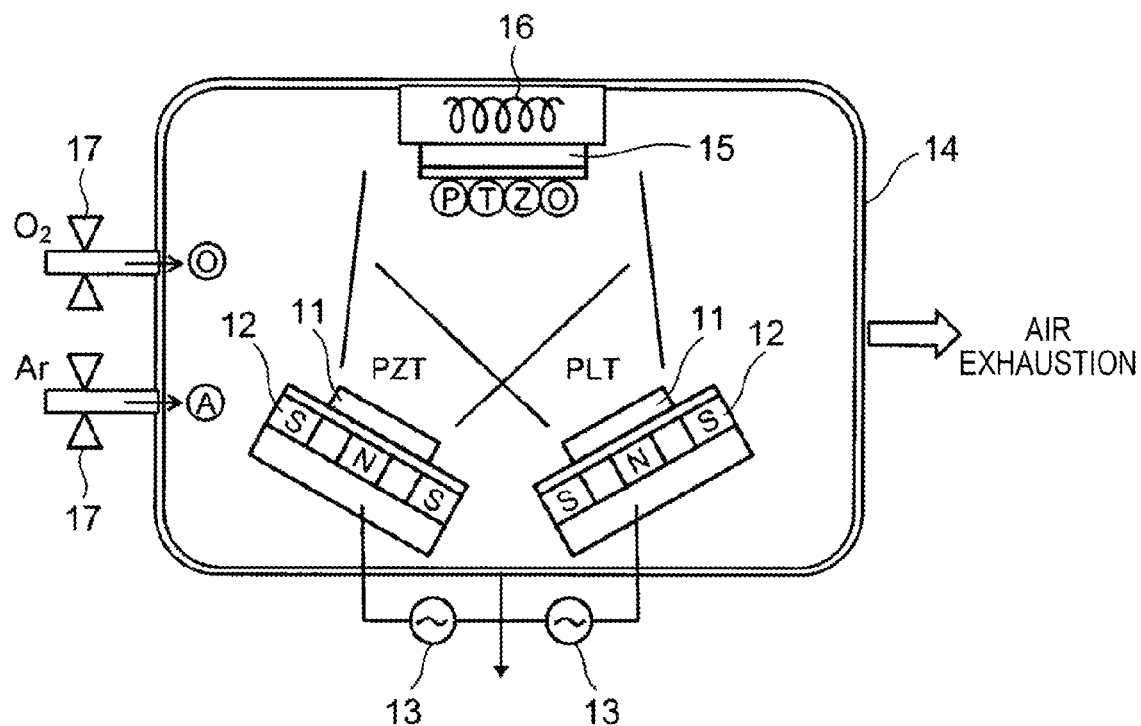
FIG. 5 is a cross-sectional view illustrating a schematic configuration of a sputtering apparatus that deposits the underlying layer and a piezoelectric layer of the piezoelectric element.

FIG. 5 is a cross-sectional view illustrating a schematic configuration of a sputtering apparatus that deposits the underlying layer 4 and the piezoelectric layer 5. The underlying layer 4 and the piezoelectric layer 5 can be deposited by one high-frequency magnetron sputtering apparatus.

In FIG. 5, a reference numeral 11 denotes a target, 12 a magnet, 13 a high-frequency power supply, 14 a vacuum chamber, 15 a substrate, 16 a heater, and 17 a valve. There are two systems of the target 11, the magnet 12, and the high-frequency power supply 13 for the deposition of the underlying layer 4 and the deposition of the piezoelectric layer 5. The targets 11 are placed at a predetermined angle in the vacuum chamber 14 in such a manner as to face the direction of the substrate 15.

Firstly, the powders of materials of PLT and PZT, which have been prepared at a predetermined composition ratio, are mixed, fired, ground, filled in a retainer plate, and applied pressure by a press machine. Accordingly, the targets 11 of PLT and PZT are created, respectively. A plate carrying the target 11 is mounted on the magnet 12. A cover (not illustrated) is mounted thereon. The magnet 12 and the high-frequency power supply 13 are insulated from the vacuum chamber 14 by an insulator (not illustrated).

Next, the substrate 15 is mounted on the heater 16. Air is then exhausted from the vacuum chamber 14. The substrate 15 is heated to 600° C. by the heater 16. After heating, the valve 17 is opened. Oxygen ($O_2$) and argon (Ar) of a sputtering gas are introduced into the vacuum chamber 14 at a predetermined ratio, and the degree of vacuum is maintained at a predetermined value. The high-frequency power supply 13 applies power to the targets 11 to generate plasma. PLT and PZT are deposited on the substrate 15.

At this point in time, power to be applied to the targets 11 of PLT and PZT are controlled in time such that the composition rates of La and Zr of the underlying layer 4 in the film thickness direction change as illustrated in FIG. 3. The ratio of PLT and PZT is changed. In other words, power is applied to only the target 11 of PLT in the early stage of the deposition of the underlying layer 4. The power to be applied to the target 11 of PLT is gradually decreased while the power to be applied to the target 11 of PZT is increased. Lastly, the power to be applied to the target 11 of PLT is stopped and power is applied to only the target 11 of PZT. In this manner, the power to be applied to the targets 11 is controlled. Accordingly, the underlying layer 4 whose composition changes continuously in the film thickness direction can be formed.

After the underlying layer 4 with a predetermined thickness is formed, power is applied to only the target 11 of PZT and the deposition of the piezoelectric layer 5 is continued until a desired film thickness is obtained. In this manner, the underlying layer 4 and the piezoelectric layer 5 can be continuously deposited.

[5. Application Example of Piezoelectric Element]

Figure 6:
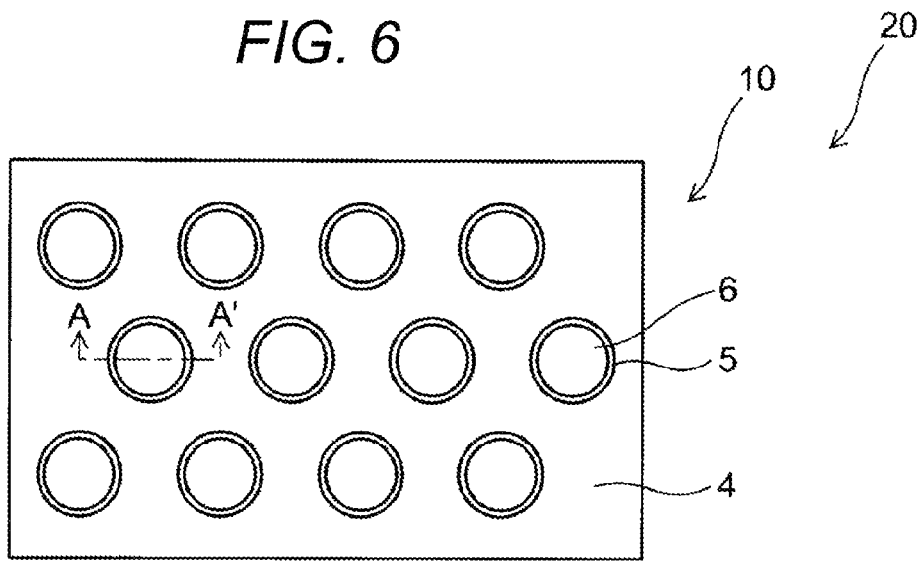
FIG. 6 is a plan view illustrating the configuration of a piezoelectric device where the piezoelectric element has been applied to a diaphragm.
Figure 7:
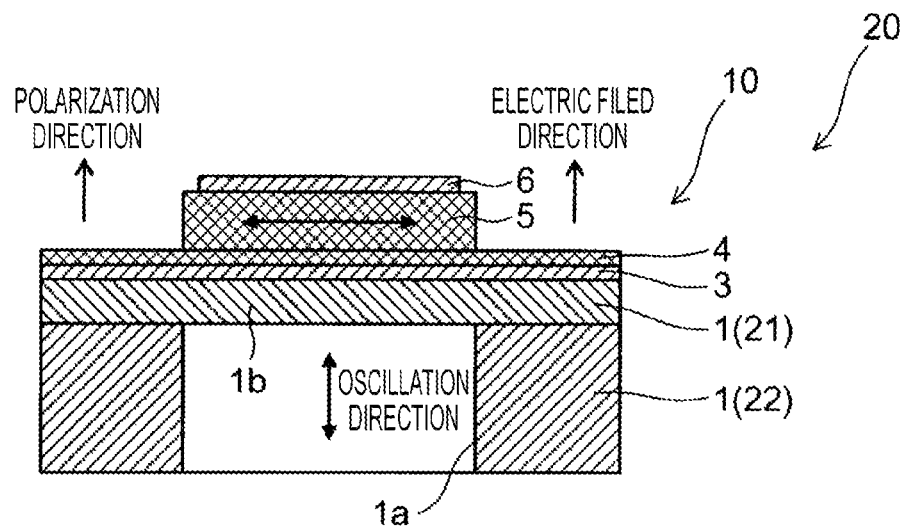
FIG. 7 is a cross-sectional view taken along the arrow A-A' of FIG. 6.

FIG. 6 is a plan view illustrating the configuration of a piezoelectric device 20 where the piezoelectric element 10 created in the embodiment has been applied to a diaphragm (diaphragm). FIG. 7 is a cross-sectional view taken along the arrow A-A' of FIG. 6. It is assumed here that a $d_{31}$ deformation (the electric field direction and the polarization direction are the same and the deformation (expansion and contraction) is perpendicular to them) of the piezoelectric layer 5 is used to drive the piezoelectric device 20.

The piezoelectric device 20 is configured forming an opening portion in the substrate 1 of the piezoelectric element 10. More specifically, the substrate 1 is configured pasting two Si substrates 21 and 22. An opening portion 1a with a circular cross section is formed in one Si substrate 22 (supporting substrate). A portion of the Si substrate 21, the portion being located above the opening portion 1a (a portion serving as an upper wall of the opening portion 1a) serves as a diaphragm 1b. The substrate 1 may be formed of one Si substrate, and a part of the Si substrate in the thickness direction may be removed to form an opening portion and a portion remaining thereabove may serve as a diaphragm.

The piezoelectric layers 5 are placed in a two-dimensional staggered form in necessary areas of the substrate 1. The lower electrode 3 and the upper electrode 6 are connected to an external control circuit by unillustrated wiring. The piezoelectric layer 5 is located above the opening portion 1a, but may be extracted from above the opening portion 1a to above a side wall of the opening portion 1a to extract the upper electrode 6. In other words, the piezoelectric layer 5 is simply required to be located at least above the opening portion 1a.

The control circuit applies an electrical signal to the lower electrode 3 and the upper electrode 6, which sandwich a predetermined piezoelectric layer 5, and accordingly only the predetermined piezoelectric layer 5 can be driven. In other words, if a predetermined electric field is applied to the lower and upper electrodes of the piezoelectric layer 5, the piezoelectric layer 5 expands and contracts in the left-right direction, and the piezoelectric layer 5 and the diaphragm 1b bend in the up-down direction due to the bi-metallic effect. Therefore, if gas or liquid is filled in the opening portion 1a of the substrate 1, the piezoelectric device 20 can be used as a pump, and becomes suitable for, for example, an inkjet head.

Moreover, the amount of charge of the predetermined piezoelectric layer 5 is detected via the lower electrode 3 and the upper electrode 6. Accordingly, the amount of deformation of the piezoelectric layer 5 can also be detected. In other words, if the piezoelectric layer 5 is oscillated by a sound wave or ultrasound wave, an electric field is generated between the upper and lower electrodes due to an inverse effect to the above. Therefore, it is also possible to use the piezoelectric device 20 as a sensor (ultrasonic sensor) by detecting the size of the electric field and the frequency of the detected signal at this point in time.

Moreover, PZT forming the piezoelectric layer 5 has pyroelectricity and ferroelectricity, in addition to the piezoelectric properties. Accordingly, it is also possible to use the piezoelectric element 10 as a device such as an infrared sensor (heat sensor) or a non-volatile storage memory.

Figure 8:
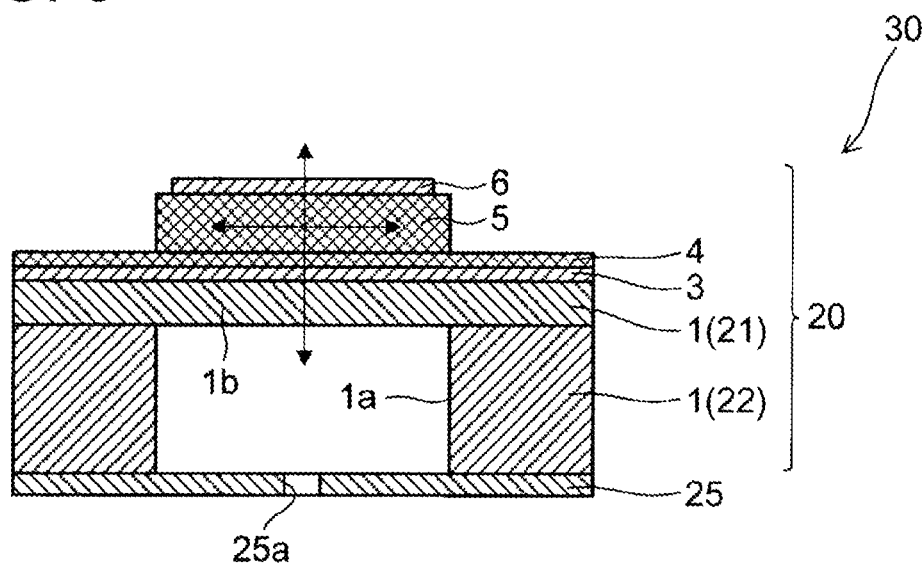
FIG. 8 is a cross-sectional view of an inkjet head including the piezoelectric device.

A supplemental description is given of the above inkjet head. FIG. 8 is a cross-sectional view of an inkjet head 30 including the piezoelectric device 20. The inkjet head 30 is configured bonding (for example, anodic bonding) a nozzle plate 25 to the substrate 1 of the piezoelectric device 20 via an unillustrated glass plate. The nozzle plate 25 has a nozzle opening 25a. The opening portion 1a formed in the substrate 1 communicates with the outside through the nozzle opening 25a. Moreover, the opening portion 1a is coupled to an unillustrated ink feed path and functions as a pressure chamber that accommodates ink supplied from the ink feed path. In this configuration, voltage is applied to the lower electrode 3 and the upper electrode 6 to bend the diaphragm 1b, and pressure is thus added to the ink in the opening portion 1a. Accordingly, the ink can be caused to be discharged to the outside via the nozzle opening 25a.

Figure 9:
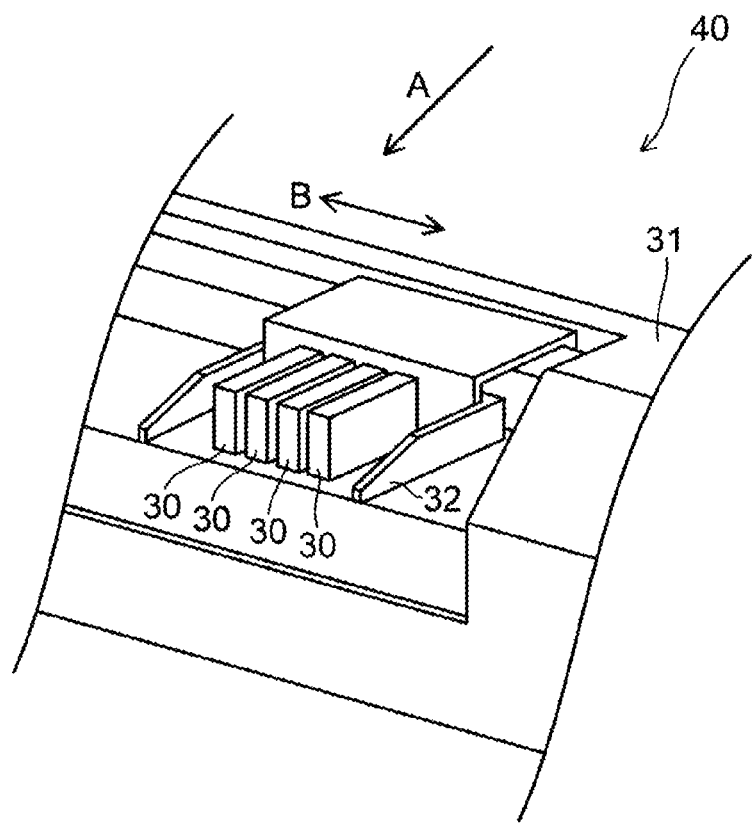
FIG. 9 is a perspective view enlarging and illustrating a part of an inkjet printer including the inkjet head.
Figure 10:
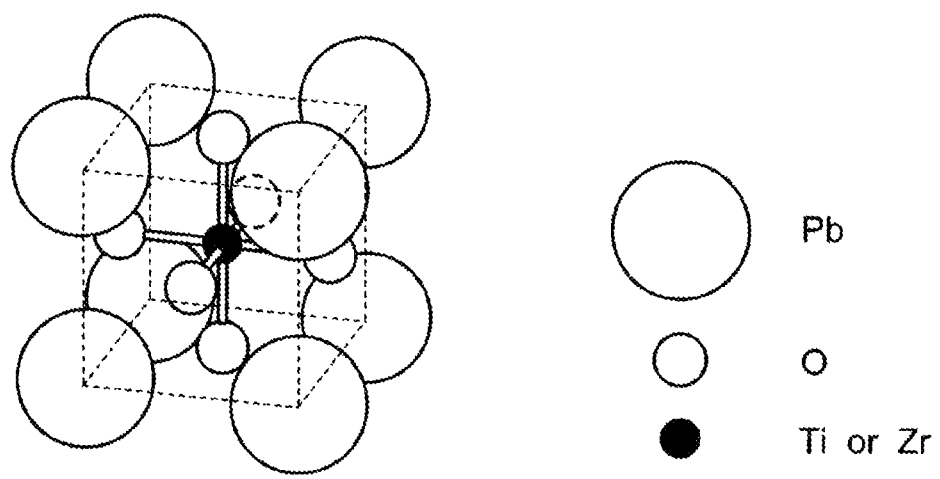
FIG. 10 is an explanatory view schematically illustrating the crystal structure of PZT.
Figure 11:
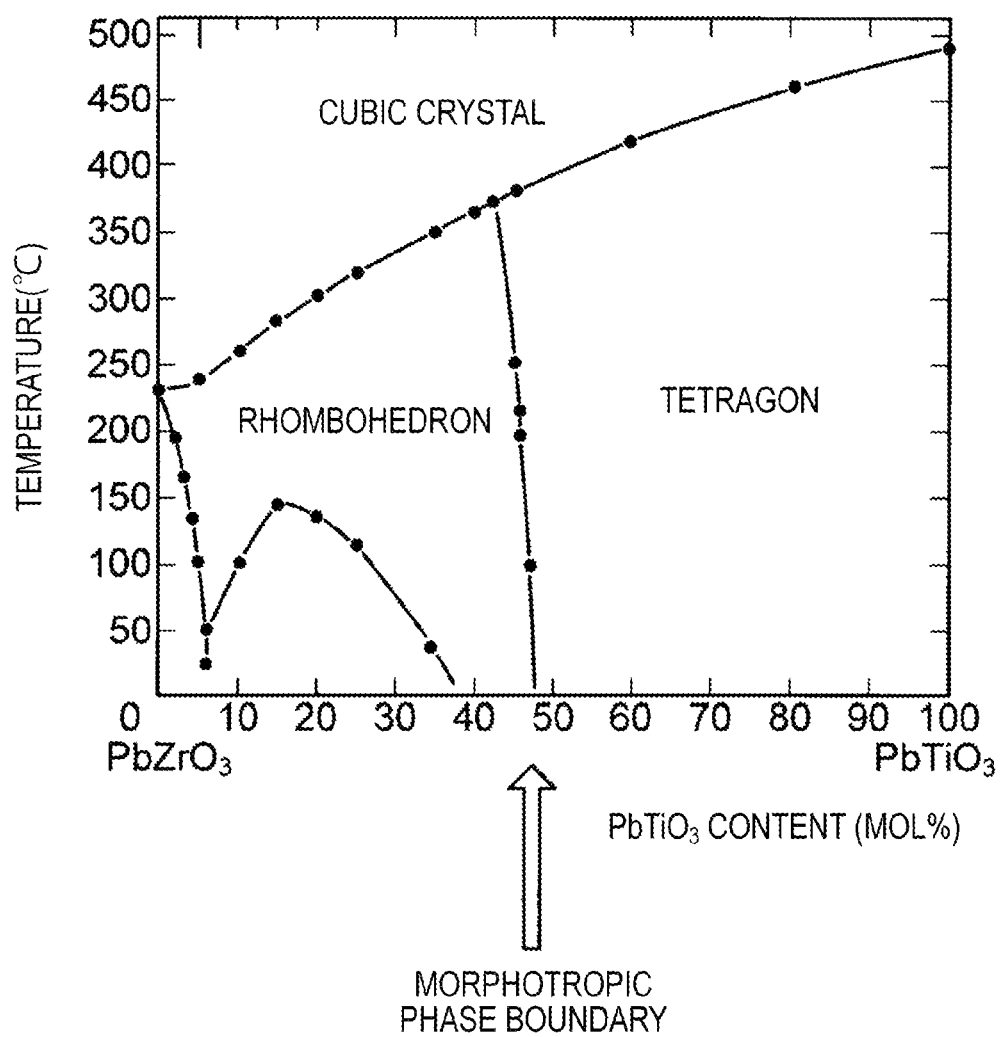
FIG. 11 is a graph illustrating the relationship between the composition ratio of PTO to PZO and the crystal system.
Figure 12:
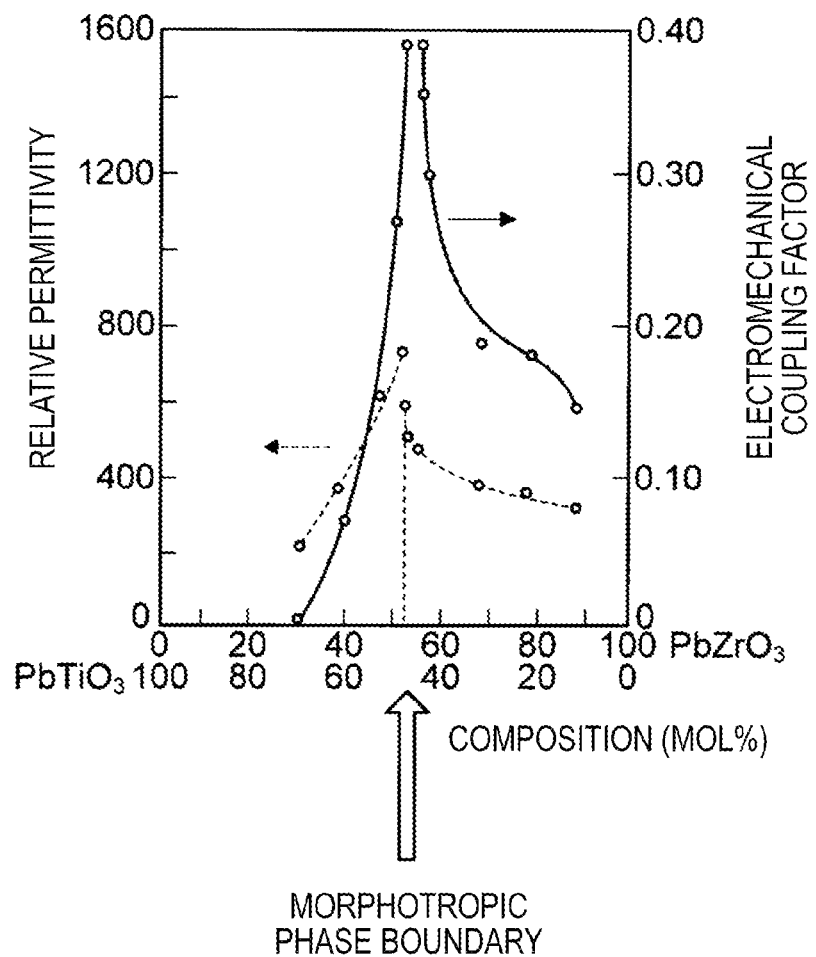
FIG. 12 is a graph illustrating the relationship between the composition ratio of PTO to PZO and the properties.

Moreover, FIG. 9 is a perspective view enlarging and illustrating a part of an inkjet printer 40 including the inkjet head 30. The inkjet printer 40 includes a carriage 32, which can move in the left-right direction (Direction B in the figure), in a housing 31, a part of which is open. The inkjet heads 30 corresponding to a plurality of colors (for example, four colors of yellow, magenta, cyan, and black) are mounted in line in the carriage 32. While an unillustrated recording medium is carried from the rear side to the front side (Direction A in the figure) of the printer, the carriage 32 is moved to the left and right to discharge the color inks from their corresponding inkjet heads 30. Accordingly, a color image can be formed on the recording medium.

[6. Others]

In the above description, the example where PZT and PLZT are used as the piezoelectric layer 5 has been described. However, in addition, piezoelectric materials having high properties can also be used, such as PNN-PT (a solid solution of $Pb(Ni_{1/3}Nb_{2/3})O_3$ and $PbTiO_3$), PZN-PT (a solid solution of $Pb(Zn_{1/3}Nb_{2/3})O_3$ and $PbTiO_3$), PMN-PT (a solid solution of $Pb(Mg_{1/3}Nb_{2/3})O_3$ and $PbTiO_3$), and KNN (a solid solution of $KNbO_3$ and $NaNbO_3$), BFO (a solid solution of $BiFeO_3$ and $BiKTiO_3$). For example, PNN-PT, PZN-PT, and PMN-PT are respectively required to change the total composition rate of Ni and Nb ((Ni+Nb)/(Ni+Nb+Ti)), the total composition rate of Zn and Nb ((Zn+Nb)/(Zn+Nb+Ti)), and the total composition rate of Mg and Nb ((Mg+Nb)/(Mg+Nb+Ti) as in the composition rate of Zr illustrated in the embodiment.

In the above description, the example of forming the interface-with-the-base side of the underlying layer 4 with PLT has been described. However, in addition, another metal oxide with the perovskite structure, such as STO ($SrTiO_3$), SRO ($SrRuO_3$), or LNO ($LaNiO_3$), may be formed on the interface-with-the-base side of the underlying layer 4.

The piezoelectric element described above is a piezoelectric element including, on a base, an underlying layer for controlling the crystallinity of a piezoelectric layer, and the piezoelectric layer, where the piezoelectric layer includes a crystal with an $ABO_3$-type structure having at least Pb at the A sites, and in the underlying layer, an interface-with-the-base side is configured including at least Pb and another substance with a different composition rate from that of the piezoelectric layer at the A sites, and a substance with a different composition ratio from that of the piezoelectric layer at the B sites and accordingly has a predetermined crystal structure with better crystallinity than the piezoelectric layer, and a layer above the interface-with-the-base side is configured to approach the composition of the piezoelectric layer by progressively changing the composition rate of the other substance included at the A sites of the underlying layer and also the composition ratio of the substance included at the B sites from the interface-with-the-base side toward the interface-with-the-piezoelectric-layer side.

The interface-with-the-base side of the underlying layer is configured including at least Pb and the other substance with a different composition rate from that of the piezoelectric layer at the A sites, and the substance with a different composition ratio from that of the piezoelectric layer at the B sites and accordingly has a predetermined (perovskite) crystal structure with better crystallinity than the piezoelectric layer. The layer above the interface-with-the-base side of the underlying layer approaches the composition of the piezoelectric layer by progressively changing the composition rate of the other substance included at the A sites of the underlying layer and also the composition ratio of the substance included at the B sites from the interface-with-the-base side toward the interface-with-the-piezoelectric-layer side. Consequently, it is possible to avoid a sudden change in composition between the layer on the interface-with-the-base side and the layer thereabove in the underlying layer. Therefore, it is possible to form the layer above the interface-with-the-base side while inheriting the excellent crystallinity (perovskite crystallinity) of the interface-with-the-base side. The perovskite crystallinity can be made excellent across the entire underlying layer. As a result, the piezoelectric layer can be formed on the underlying layer with excellent crystallinity from near the interface with the underlying layer. In addition, the underlying layer approaches the composition of the piezoelectric layer intended to form, toward the interface-with-the-piezoelectric-layer side. Accordingly, it becomes easy to form the piezoelectric layer on the underlying layer with desired composition (a composition forming the morphotropic phase boundary).

In this manner, the piezoelectric layer can be formed on the underlying layer with excellent crystallinity and desired composition. Accordingly, the piezoelectric properties can be improved while the reliability of the piezoelectric layer such as adhesion and dielectric strength can also be improved.

The piezoelectric layer includes PZT or one where an additive has been added to PZT. The underlying layer may be configured such that the interface-with-the-base side is PLT including Pb and La at the A sites, and the layer above PLT approaches the composition of the piezoelectric layer by progressively decreasing the composition rate of La included in the underlying layer and also progressively increasing the composition rate of Zr from the interface-with-the-base side toward the interface-with-the-piezoelectric-layer side.

The interface-with-the-base side of the underlying layer includes PLT. Therefore, an excellent perovskite crystal tends to occur. In the layer above PLT, the composition rate (composition ratio and concentration) of La being one of structural elements of PLT decreases and also the composition rate of Zr increases, from the PLT side toward the interface-with-the-piezoelectric-layer side. Accordingly, the composition approaches that of the piezoelectric layer. Hence, it is possible to avoid a sudden change in composition between PLT and the layer thereabove. Consequently, it is possible to form the layer above PLT while inheriting the excellent perovskite crystallinity of PLT, and has excellent perovskite crystallinity across the underlying layer. Therefore, it is possible to form the piezoelectric layer (PZT or one where an additive has been added to PZT) with excellent crystallinity, on the underlying layer from near the interface with the underlying layer. As a result, the piezoelectric properties and reliability, such as adhesion and dielectric strength, of the piezoelectric layer can be surely improved.

The piezoelectric layer is any of PNN-PT, PZN-PT, and PMN-PT. The layer above the interface-with-the-base side in the underlying layer may be configured such that the total composition rate of Ni and Nb included in the underlying layer in the case of PNN-PT, the total composition rate of Zn and Nb included in the underlying layer in the case of PZN-PT, and the total composition rate of Mg and Nb included in the underlying layer in the case of PMN-PT increase from the interface-with-the-base side toward the interface-with-the-piezoelectric-layer side to approach the composition ratio of the piezoelectric layer.

Also if the piezoelectric layer includes any of PNN-PT, PZN-PT, and PMN-PT, the total composition rate of predetermined elements in the layer above the interface-with-the-base side in the underlying layer is increased toward the interface-with-the-piezoelectric-layer side to approach the composition ratio of the piezoelectric layer. Accordingly, the piezoelectric layer can be formed on the underlying layer with excellent crystallinity, from near the interface side with the underlying layer. As a result, the piezoelectric layer's piezoelectric properties and reliability such as adhesion and dielectric strength can be surely improved. Especially, a relaxer material such as PNN-PT, PZN-PT, or PMN-PT is used for the piezoelectric layer. Accordingly, the piezoelectric properties higher than PZT can be surely achieved.

The underlying layer may be configured such that the interface-with-the-base side is PLT including La at the A sites, and that in the layer above PLT, the composition rate of La included in the underlying layer decreases from the interface-with-the-base side toward the interface-with-the-piezoelectric-layer side.

The interface-with-the-base side of the underlying layer includes PLT. Therefore, an excellent perovskite crystal tends to occur. In the layer above PLT, the composition rate of La decreases from the PLT side toward the interface-with-the-piezoelectric-layer side. Accordingly, the composition ratio of the layer above PLT can approach the composition ratio of the piezoelectric layer toward the interface-with-the-piezoelectric-layer side. Consequently, it is possible to avoid a sudden change in composition between PLT and the layer above PLT, form the layer above PLT while inheriting the excellent perovskite crystallinity of PLT, make the perovskite crystallinity excellent across the underlying layer, and surely form the piezoelectric layer (including any of PNN-PT, PZN-PT, and PMN-PT) on the underlying layer with excellent crystallinity from near the interface with the underlying layer.

In the underlying layer of the piezoelectric element, the interface-with-the-piezoelectric-layer side is desired to have the same composition with the piezoelectric layer. In this case, the piezoelectric layer with desired composition can be surely formed on the underlying layer.

If the piezoelectric layer is PZT or PZT to which an additive has been added, the Ti/Zr ratio of the piezoelectric layer in the piezoelectric element is desired to be a ratio forming the morphotropic phase boundary. In this case, the piezoelectric properties can be dramatically improved as compared to other Ti/Zr ratios.

In the piezoelectric element, the base includes a substrate and a lower electrode located on a substrate side of the piezoelectric layer. The piezoelectric element may further include an upper electrode located on a side of the piezoelectric layer, the side being opposite to the lower electrode. In this case, a configuration can be achieved in which voltage is applied to the upper and lower electrodes to deform the piezoelectric layer, or conversely a potential difference caused when the piezoelectric layer is deformed is extracted from the upper and lower electrodes.

Moreover, the above-described piezoelectric device includes the above piezoelectric element. An opening portion is formed in the substrate of the piezoelectric element. The piezoelectric layer may be located at least above the opening portion.

If liquid (for example, ink) or gas is filled in the opening portion, it is possible to discharge the liquid or the like to the outside by applying voltage to the upper and lower electrodes, deforming the piezoelectric layer, and adding pressure to the liquid or the like in the opening portion. Therefore, in this case, it is possible to realize a piezoelectric device that functions as a pump (also including an inkjet head). Moreover, if a potential difference caused by a displacement of the piezoelectric layer when a sound wave or ultrasound wave is received via the opening portion is designed to be detected via the upper and lower electrodes, a piezoelectric device that functions as an ultrasonic sensor can also be realized.

According to the above configuration, in the layer above PLT in the underlying layer, the composition rate of La decreases and also the composition rate of Zr, the composition rate of the sum of Ni and Nb, the composition rate of the sum of Zn and Nb, or the composition rate of the sum of Mg and Nb increases from the PLT side toward the interface-with-the-piezoelectric-layer side. Accordingly, the composition approaches that of the piezoelectric layer. Consequently, the piezoelectric layer can be formed on the underlying layer with excellent crystallinity and desired composition. The piezoelectric properties and reliability can be improved.

INDUSTRIAL APPLICABILITY

The piezoelectric element of the present invention can be used for various devices such as inkjet heads, ultrasonic sensors, infrared sensors, and nonvolatile memories, and inkjet printers.

REFERENCE SIGNS LIST

1 Substrate (base)
1a Opening portion
2 Thermal oxide film (base)
3 Lower electrode (base)
4 Underlying layer
5 Piezoelectric layer
6 Upper electrode
10 Piezoelectric element
20 Piezoelectric device
30 Inkjet head
40 Inkjet printer

The invention claimed is:

1. A piezoelectric element comprising:
on a base, an underlying layer for controlling crystallinity of a piezoelectric layer, wherein the piezoelectric layer comprises a crystal with an $ABO_3$-type structure comprising at least Pb at A sites of the piezoelectric layer; and
the underlying layer comprising:
a first layer lying above an interface-with-the-base side of the first layer is configured to have an $ABO_3$-type structure and comprises at least Pb and a first substance with a different composition rate from that of the piezoelectric layer at A sites, and a second substance with a different composition rate from that of the piezoelectric layer at B sites, and accordingly has a predetermined crystal structure with a higher degree of crystallinity than the piezoelectric layer; and
a second layer sandwiched between the first layer and the piezoelectric layer, wherein the second layer is configured to have an $ABO_3$-type structure and approaches a composition of the piezoelectric layer by progressively changing a composition rate of the first substance at A sites of the second layer and also the composition rate of the second substance included at B sites of the second layer, in a direction from the interface-with-the-base side toward an interface-with-the-piezoelectric-layer side.

2. The piezoelectric element according to claim 1, wherein
the piezoelectric layer comprises PZT, and
in the underlying layer, the first layer is PLT including Pb and La at A sites of the first layer, and
in the second layer, the composition rate of La at the A sites of the second layer progressively decreases and also the composition rate of Zr at the B sites of the second layer progressively increases along the direction to approach the composition of the piezoelectric layer.

3. The piezoelectric element according to claim 1, wherein
the piezoelectric layer is any of PNN-PT, PZN-PT, and PMN-PT, and
in the second layer, the total composition rate of Ni and Nb in a case of PNN-PT, the total composition rate of Zn and Nb in a case of PZN-PT, and the total composition rate of Mg and Nb in a case of PMN-PT progressively increase along the direction to approach the composition rate of the piezoelectric layer.

4. The piezoelectric element according to claim 3, wherein in the underlying layer, the first layer is PLT including La at A sites of the first layer, and in the second layer, the composition rate of La at the A sites of the second layer progressively decreases along the direction.

5. The piezoelectric element according to claim 1, wherein in the underlying layer, the interface-with-the-piezoelectric-layer side has the same composition as the piezoelectric layer.

6. The piezoelectric element according to claim 1, wherein a Ti/Zr ratio of the piezoelectric layer is a ratio forming a morphotropic phase boundary.

7. The piezoelectric element according to claim 1, wherein
the base comprises a substrate and a lower electrode located on a substrate side of the piezoelectric layer, and
the piezoelectric element further comprises an upper electrode located on a side of the piezoelectric layer, the side being opposite to the lower electrode.

8. The piezoelectric element according to claim 7, wherein
the substrate of the base includes an opening portion formed therein, and
the piezoelectric layer is located at least above the opening portion.

9. An inkjet head comprising a nozzle opening causing the opening portion to communicate with the outside, wherein it is configured such that ink in the opening portion is discharged from the nozzle opening by use of the piezoelectric element according to claim 8.

10. An inkjet printer comprising the inkjet head according to claim 9.

11. The piezoelectric element according to claim 2, wherein in the second layer, the interface-with-the-piezoelectric-layer side has the same composition as the piezoelectric layer.

12. The piezoelectric element according to claim 2, wherein a Ti/Zr ratio of the piezoelectric layer is a ratio forming a morphotropic phase boundary.

13. The piezoelectric element according to claim 2, wherein the base comprises a substrate and a lower electrode located on a substrate side of the piezoelectric layer, and
the piezoelectric element further comprises an upper electrode located on a side of the piezoelectric layer, the side being opposite to the lower electrode.

14. The piezoelectric element according to claim 3, wherein in the second layer, the interface-with-the-piezoelectric-layer side has the same composition as the piezoelectric layer.

15. The piezoelectric element according to claim 3, wherein
the base comprises a substrate and a lower electrode located on a substrate side of the piezoelectric layer, and
the piezoelectric element further comprises an upper electrode located on a side of the piezoelectric layer, the side being opposite to the lower electrode.

16. The piezoelectric element according to claim 4, wherein in the second layer, the interface-with-the-piezoelectric-layer side has the same composition as the piezoelectric layer.

17. The piezoelectric element according to claim 4, wherein
the base comprises a substrate and a lower electrode located on a substrate side of the piezoelectric layer, and
the piezoelectric element further comprises an upper electrode located on a side of the piezoelectric layer, the side being opposite to the lower electrode.

18. The piezoelectric element according to claim 5, wherein
the base comprises a substrate and a lower electrode located on a substrate side of the piezoelectric layer, and
the piezoelectric element further comprises an upper electrode located on a side of the piezoelectric layer, the side being opposite to the lower electrode.

19. The piezoelectric element according to claim 6, wherein
the base comprises a substrate and a lower electrode located on a substrate side of the piezoelectric layer, and
the piezoelectric element further comprises an upper electrode located on a side of the piezoelectric layer, the side being opposite to the lower electrode.

20. The piezoelectric element according to claim 2, wherein the composition rate of La in the PLT of the first layer is 5 to 15%.

21. The piezoelectric element according to claim 4, wherein the composition rate of La in the PLT of the first layer is 5 to 15%.

* * * * *